(12) United States Patent
Adan

(10) Patent No.: US 7,132,881 B2
(45) Date of Patent: Nov. 7, 2006

(54) ACTIVE FILTER

(75) Inventor: Alberto Oscar Adan, Ikoma (JP)

(73) Assignee: Sharp Kabushiki Kaisha (JP)

( * ) Notice: Subject to any disclaimer, the term of this patent is extended or adjusted under 35 U.S.C. 154(b) by 0 days.

(21) Appl. No.: 10/997,670

(22) Filed: Nov. 24, 2004

(65) Prior Publication Data

US 2005/0162219 A1   Jul. 28, 2005

(30) Foreign Application Priority Data

Jan. 27, 2004   (JP) ............................. 2004-018532

(51) Int. Cl.
*H03K 5/00* (2006.01)
(52) U.S. Cl. ..................................... 327/554; 327/337
(58) Field of Classification Search ........ 327/551–559, 327/94, 337, 362; 330/9
See application file for complete search history.

(56) References Cited

U.S. PATENT DOCUMENTS

| | | | |
|---|---|---|---|
| 4,498,063 A | 2/1985 | Makabe et al. | |
| 4,743,872 A | 5/1988 | Tanimoto | |
| 4,984,292 A * | 1/1991 | Millen | 455/40 |
| 5,999,042 A * | 12/1999 | Hemdal et al. | 327/554 |
| 6,344,773 B1 * | 2/2002 | Sevastopoulos et al. | 327/558 |
| 6,816,004 B1 * | 11/2004 | Easwaran et al. | 327/552 |

* cited by examiner

*Primary Examiner*—Dinh T. Le
(74) *Attorney, Agent, or Firm*—David G. Conlin; George N. Chaclas; Edwards Angell Palmer & Dodge, LLP

(57) ABSTRACT

In order to reduce capacitance of a feedback section of an operational amplifier provided in a semiconductor integrated device, an active filter includes an operational amplifier in which a plurality of capacitive elements are connected between (i) an output terminal and (ii) an inverting input terminal or an input terminal. This arrangement does not require any special technique and amendment of an ordinary integrated circuit process. Further, this arrangement ensures small capacitance in the feedback section of the operational amplifier, while preventing deterioration in S/N ratio, and increases in switching noise and power consumption.

12 Claims, 4 Drawing Sheets

ACTIVE FILTER

CROSS-REFERENCE TO RELATED APPLICATION

This Nonprovisional application claims priority under 35 U.S.C. § 119(a) on Patent Application No. 2004/018532 filed in Japan on Jan. 27, 2004, the entire contents of which are hereby incorporated by reference.

FIELD OF THE DISCLOSURE

The present disclosure technology relates to an active filter that can reduce capacitance of a feedback section of an operational amplifier provided in a semiconductor integrated circuit device.

BACKGROUND OF THE DISCLOSURE

An analog frequency filter is a common building block in communication, audio, signal processing, and the like. An analog active filter is realized, in a semiconductor integrated circuit, by an operational amplifier, a resistor(s), a capacitor(s), and an inductor(s). The operational amplifier serves as an active element, whereas the resistor(s), the capacitor(s), and the inductor serve as passive components.

In general, integration of inductors in a semiconductor occupies a large area, and is avoided, accordingly. Among the many kinds of active filters, a switched capacitor filter, carrying out a time-sample operation in which the resistors are replaced with switched capacitors, is widely used in analog signal processing applications. The switched-capacitor filter has an advantage because the transfer function of the filter is determined by a capacitance ratio and a sampling frequency. Hence, accurate characteristics can be realized.

For continuous time signal processing, RC active filters, MOSFET-C filters, and Gm-C filters are also used. In these realizations, circuit or filter characteristics vary depending on equivalent RC (resistor-capacitor) products, a resistance ratio, and a capacitance ratio.

A transfer function H(s) of a typical analog filter can be found by the product of a single-pole $H_1(s)$ transfer function and a second-order (Biquad) $H_2(s)$ transfer function. Considered here is a concrete example of a low-pass filter for implementing a fourth-order Butterworth response. Two Biquad sections connected in cascade can be used to realize the filter as shown in FIG. 4(b).

FIG. 4(a) is a circuit diagram illustrating a circuitry of an analog active RC filter realized as the Biquad section. If transfer functions of first and second stages of the Biquad sections are indicated by $H_{21}(s)$ and $H_{22}(s)$, respectively, then a transfer function H(s) of FIG. 4(b) satisfies the following formula:

$$H(s) = H_{21}(s) \times H_{22}(s) \quad \text{[Formula 1]}$$

$$H_{21} = \frac{-\left(\frac{R_{21}}{R_{11}}\right)}{1 + sC_{21}R_{31}\left(1 + \frac{R_{21}}{R_{11}} + \frac{R_{21}}{R_{31}}\right) + s^2 C_{11} C_{21} R_{21} R_{31}}$$

-continued $$H_{22} = \frac{-\left(\frac{R_{22}}{R_{12}}\right)}{1 + sC_{22}R_{32}\left(1 + \frac{R_{22}}{R_{12}} + \frac{R_{22}}{R_{32}}\right) + s^2 C_{12} C_{22} R_{22} R_{32}}$$

If it is assumed that each resistance in the formula is equal to R, the formula can be simplified as follows:

$$H_{21} = \frac{-1}{1 + s3C_{21}R + s^2 C_{11} C_{21} R^2} \quad \text{[Formula 2]}$$

$$H_{22} = \frac{-1}{1 + s3C_{22}R + s^2 C_{12} C_{22} R^2}$$

$C_{2j}$ is assumed to be reference capacitance of each stage, and a ratio $k_j$ of the j-th stage is defined as follows:

$$H_{21} = \frac{-1}{1 + s3C_{21}R + s^2 k_1 C_{21}^2 R^2} \quad k_1 = \frac{C_{11}}{C_{21}} \quad \text{[Formula 3]}$$

$$H_{22} = \frac{-1}{1 + s3C_{22}R + s^2 k_2 C_{22}^2 R^2} \quad k_2 = \frac{C_{12}}{C_{22}}$$

For example, for the fourth-order low-pass Butterworth response, the following ratios are found:

$k_1$=15.36 and $k_2$=2.636

In general, as the order of the filter increases, the capacitance ratio increases. As another example, for an eighth-order low-pass Butterworth filter, a maximum capacitance ratio satisfies: kmax=59.1. Meanwhile, for the purpose of reducing an area that the capacitor occupies, a capacitor having very small capacitance of approximately 0.2 pF or less is used. However, it is difficult to control the very small capacitance of such a capacitor. Thus, a large capacitance ratio is undesirable. For example, if it is assumed that the maximum capacitance of a capacitor for use in the eighth-order filter is limited to 5 pF ($C_1$), then a capacitance $C_2$ satisfies $C_2$=5 pF/59.1($\approx$0.084 pF), which is on the order of the layout parasitic capacitance, and therefore difficult to control.

U.S. Pat. No. 4,498,063 (hereinafter, referred to as "patent document 1", and incorporated by reference) presents a technique to reduce the capacitance needed in switched capacitor filters (see FIG. 5). In the patent document 1, the use of a resistor voltage divider reduces the capacitance ratio.

Specifically, the circuit disclosed in the patent document 1, just uses a resistor voltage divider (R1-R2) which attenuates the input signal. For instance, if the resistor voltage divider is not used, then the voltage gain of the circuit is represented by the following Formula 4, where the input signal is indicated by Vin, an output signal is indicated by Vout, capacitance of a feedback capacitor 19 is indicated by $\alpha C$. Note that $C'_4$ indicates capacitance $C_4$ in the case where no resistor divider is used.

$$\frac{V_{out}}{V_{in}} = -\frac{C'_4}{\alpha C} \quad \text{[Formula 4]}$$

The use of the resistor divider causes the input signal to be attenuated by a factor K, then, the following formula 5 is satisfied.

$$\frac{V_{out}}{V_{in}} = -\frac{C'_4}{\alpha C} \times K \qquad \text{[Formula 5]}$$

As such, if a new capacitor C4=C'4/K is used, then the same voltage gain is obtained. However, note in this case that the capacitance $C_4$ becomes larger than the capacitance $C'_4$.

This technique, however, is not adequate because the reduction of the input signal degrades the Signal-to-Noise ratio.

The circuit disclosed in U.S. Pat. No. 4,743,872 (hereinafter, referred to as "patent document 2", and incorporated by reference), similarly with the patent document 1, is intended for switched capacitor filters, in which three capacitors 3a, 3b, and 3c are arranged so as to have a T-connection (see FIG. 6). This arrangement allows the realization of reduced effective capacitance $C_Q$. A resistor 8 having high resistance values determines a potential at a joint node of the capacitors 3a, 3b, and 3c.

As shown in FIG. 6, the circuit disclosed in the U.S. Pat. No. 4,743,872, as the U.S. Pat. No. 4,498,063, is also intended for switched capacitor filters, and therefore operates using switches 2a, 2b, 2c and 2d. As a switched capacitor circuit, when the mentioned switches are commutating the capacitors 3a, 3b and 3c behave as an equivalent resistor, rather than a capacitor.

The main drawbacks of this technique are: (i) the high-value resistor introduces thermal noise into the capacitor, and (ii) the clocking of the capacitors requires a sampling frequency much higher than the cut-off frequency of the filter. This causes an increase in switching noise and power dissipation.

The analog frequency filter is a common building block in communication, audio, signal processing, and the like. The state-of-the-art implementations of high-order active R-C filters suffer from the need of high ratio of capacitances. The prior art techniques to reduce the value of capacitance ratio relies on the use of resistor-dividers (e.g., U.S. Pat. No. 4,498,063), which attenuates the input signal. This causes deterioration of the signal-to-noise ratio (SNR), when the prior art techniques are used in wireless transceivers.

Further, the prior art techniques to reduce the value of capacitance ratio uses a switched capacitor network (e.g., U.S. Pat. No. 4,743,872) with the junction node connected to a reference voltage through a high value resistor. As a result, (i) the high-value resistor introduces thermal noise into the capacitor, and (ii) the clocking of the capacitors requires a sampling frequency much higher than the cut-off frequency of the filter. This causes an increase in switching noise and power dissipation.

SUMMARY OF THE DISCLOSURE

The present disclosure addresses the foregoing problems, and one object is to reduce capacitance of a feedback section of an operational amplifier provided in a semiconductor integrated circuit device.

One embodiment of an active filter according to the present disclosure includes an operational amplifier, having (i) an output terminal and (ii) inverting and non-inverting input terminals provided in a semiconductor integrated circuit device, and a plurality of capacitive elements are connected between the output terminal and the inverting input terminal or between the output terminal and the non-inverting input terminal.

According to the present disclosure, the active filter is provided in the semiconductor integrated circuit device, and includes the operational amplifier. In the operational amplifier, the capacitive elements are provided between the output terminal and the inverting input terminal, or between the output terminal and the non-inverting input terminal.

In contrast, a conventional operational amplifier is arranged so that a single capacitive element is provided between an output terminal and an inverting input terminal, or between the output terminal and a non-inverting input terminal. For the purpose of reducing a capacitance ratio, it is desirable to reduce capacitance of the capacitive element.

However, there is a limit to reduction of the capacitance. For example, a resistor-divider to attenuate an input signal is conventionally adopted. However, this causes a deterioration of S/N ratio. Alternatively proposed is the use of a switched capacitor circuit network with the junction node connected to a reference voltage through a high-value resistor. However, this causes an increase in switching noise and power dissipation.

In view of the circumstances, according to the present disclosure, a plurality of the capacitive elements are connected between the output terminal and the inverting input terminal, or between the output terminal and the non-inverting input terminal. By appropriately connecting the capacitive elements, it becomes possible to reduce combined capacitance of the capacitive elements. Thus, the reduction of the capacitance is realized with the use of ordinary processing. In other words, it is possible to surely reduce the capacitance of the feedback section in the operational amplifier, while preventing the deterioration of S/N ratio, and the increase of the switching noise and the power dissipation. Further, it becomes possible to reduce the capacitance ratio.

Additional objects, features, and strengths of the present disclosure will be made clear by the description below. Further, the advantages of the present disclosure will be evident from the following explanation in reference to the drawings.

BRIEF DESCRIPTION OF THE DRAWINGS

FIG. 4(a) is a circuit diagram illustrating a Biquad analog active RC filter.

FIG. 4(b) is a circuit diagram illustrating a fourth-order low-pass filter realized by connecting two active RC filters of FIG. 4(a) in cascade.

DESCRIPTION OF THE EMBODIMENTS

Figure 1:
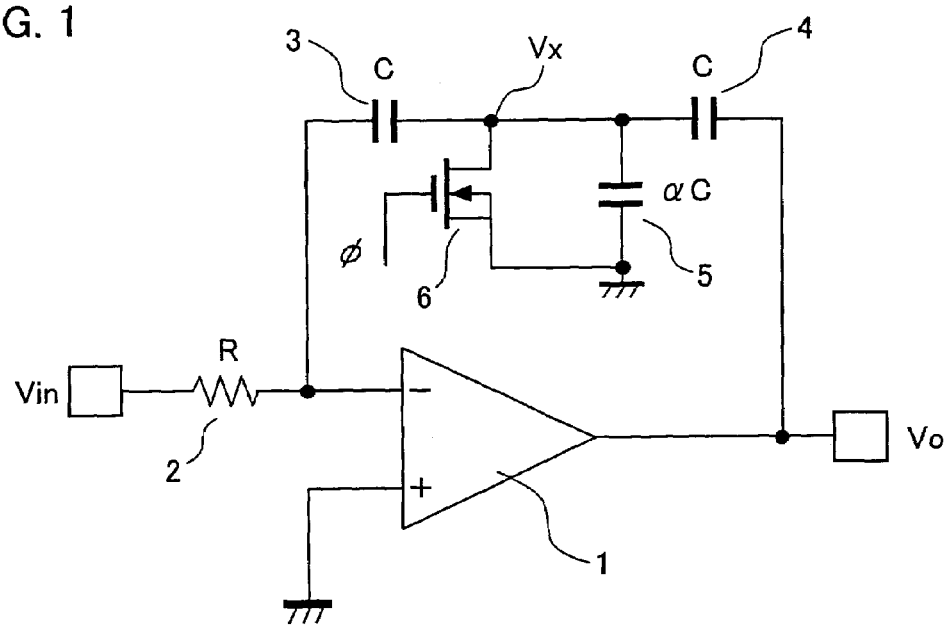
FIG. 1 is a circuit diagram illustrating an integrator circuit to which an active filter of the present disclosure is applied.
Figure 2:
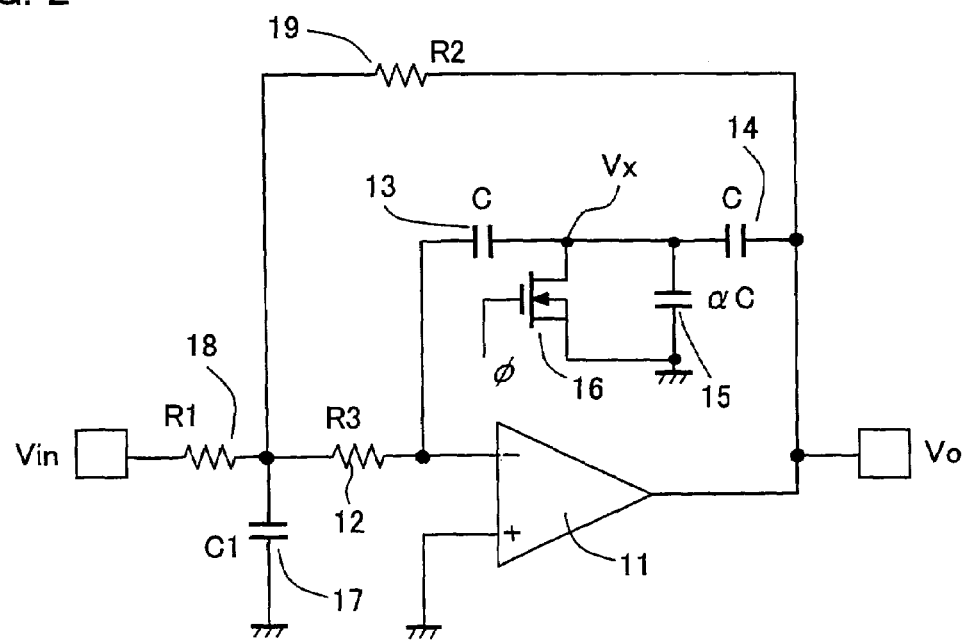
FIG. 2 is a circuit diagram illustrating an active filter of the present disclosure.
Figure 3:
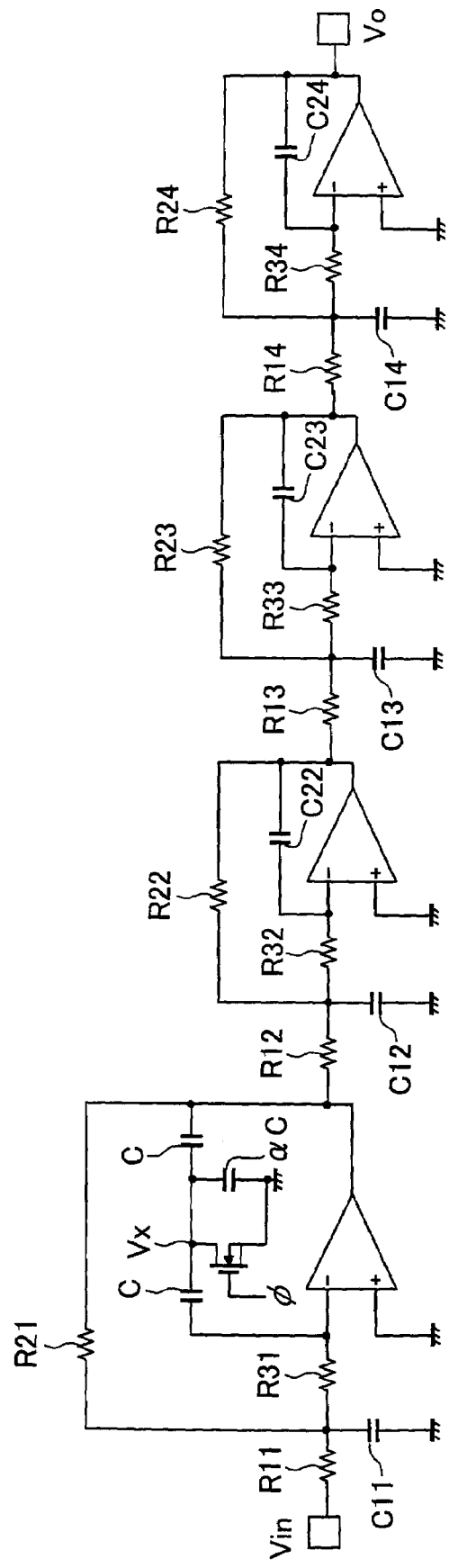
FIG. 3 is a circuit diagram illustrating another active filter of the present disclosure.

The following description deals with one embodiment of the present disclosure with reference to FIG. 1 through FIG. 3.

FIG. 1 illustrates an integrator circuit to which a main concept of an active filter of the present disclosure is applied. As shown in FIG. 1, the integrator circuit includes an operational amplifier 1, a resistor 2, a plurality of capacitors 3 through 5, an input terminal to which an analog input signal Vin is supplied, and an output terminal from which an output signal Vo is outputted.

In the integrator circuit, the resistor 2 (having resistance R) is provided between (i) an input terminal to which the analog input signal Vin is supplied and (ii) an inverting input terminal of the operational amplifier 1. The capacitors 3 through 5 are connected to one another so as to have a Tconnection between the inverting input terminal and the output terminal of the operational amplifier 1.

The resistor 2 and the capacitors 3 through 5 of the operational amplifier 1 are connected, for example in the following manner, so that a frequency response can be shaped. The frequency response is also referred to as "transfer function", which is defined by Vo/Vin.

More specifically, the capacitor 3 (having capacitance C) and the capacitor 4 (having capacitance C) are connected in series between the inverting input terminal and the output terminal of the operational amplifier 1. The capacitor 5 (having capacitance αC) is provided between (i) a junction node of the capacitors 3 and 4 and (ii) ground.

A feedback section (i.e., a section between the inverting input terminal and the output terminal) in the integrator circuit has effective capacitance which satisfies $C_{eff}$:

$$C_{eff} = C/(2+\alpha)$$

Namely, this means that, by using a large value of α for the effective capacitance (combined capacitance) of the feedback section, a small equivalent capacitance can be realized.

Here, the effective capacitance $C_{eff}$ is found as follows.

Namely, in FIG. 1, when a later described MOS field effect transistor 6 is in OFF state, the current flowing from the input through the resistor 2 is also flowing through the capacitor 3, and then splits into the capacitors 4 and 5.

$$\frac{V_{in}}{R} = -s\,CV_x = s\alpha\,CV_x + s\,C(V_x - V_o) \quad \text{[Formula 6]}$$

$$V_x = \frac{V_o}{2+\alpha} \Rightarrow \therefore \frac{V_o}{V_i} = \frac{-1}{s\left(\frac{C}{2+\alpha}\right)R}$$

The transfer function for an integrator circuit with a single capacitor $C_f(=C_{eff})$ of the feedback section (i.e., a capacitor between the output and the inverting input of the operational amplifier) is expressed as follows:

$$(V_o/V_i) = -1/s\,C_f R, \quad \text{[Formula 7]}$$

By Formula 7, $C_{eff} = C/(2+\alpha)$ can be derived.

Further, the MOS field effect transistor 6 is provided in parallel with the capacitor 5. The MOS field effect transistor 6 is in OFF (open) state during a normal operation of the integrator circuit. When turning ON the MOS field effect transistor 6, a junction node (floating node) Vx of the capacitors 3 through 5, which are connected so as to have a T-connection, is connected to ground via the MOS field effect transistor 6. By thus turning ON the MOS field effect transistor 6 at predetermined timing, it is possible to surely remove eventual electric charges accumulated at the floating node.

The turning ON of the MOS field effect transistor 6 is performed as follows. For example, before the integrator circuit is set for the normal operation mode, a brief reset pulse (φ) is applied to a gate of the MOS field effect transistor 6 so as to reset the junction node to ground.

Here, the following description explains an active filter (Biquad low-pass filter) in which the integrator circuit is used as a main component, with reference to FIG. 2. FIG. 2 illustrates an arrangement for reducing a ratio of capacitive elements (i.e., a capacitance ratio=(a maximum value among possible capacitance of an input section)/(a minimum value among possible capacitance of the feedback section)) realized by a semiconductor integrated circuit.

In the active filter of FIG. 2, three capacitors 13 through 15 are connected so as to have a T-connection within a feedback section of an operational amplifier 11, as in the integrator circuit of FIG. 1. The capacitors 13 and 14 have capacitance C, and the capacitor 15 has capacitance αC.

The capacitors (e.g., feedback capacitors) 13 through 15 are connected so as to have a T-connection, and their joint node (i.e., the floating node) Vx is connected to ground via a MOS field effect transistor 16. The MOS field effect transistor 16 can be turned ON at predetermined timing to remove eventual charges accumulated at the floating node Vx. During a normal operation of the active filter, the MOS field effect transistor 6 is in OFF state.

The active filter shown in FIG. 2 includes a single operational amplifier 11, a resistor 18 (having resistance R1), a resistor 19 (having resistance R2), a resistor 12 (having resistance R3), and a plurality of capacitors 13 through 15. The active filter has a second-order transfer function which satisfies:

$$H(s) = \frac{-K}{1 + \left(\frac{s}{\omega_o Q}\right) + \left(\frac{s}{\omega_o}\right)^2} \quad \text{[Formula 8]}$$

where s=jω indicates a complex frequency, K indicates a gain, $\omega_o$ indicates a cut-off frequency, and Q indicates a quality factor of the circuit (active filter).

The operational amplifier 11 includes two input terminals (i.e., an inverting input terminal and a non-inverting input terminal) and an output terminal. The resistors 18 and 19 set the gain K of the active filter. The resistors 18 and 12 are connected in series between an input terminal Vin and the inverting input terminal of the operational amplifier. The resistor 19 is provided between (i) the output terminal of the operational amplifier and (ii) a joint node of the resistors 18 and 12.

The capacitor 17 (having capacitance C1) is provided between (i) the joint node of the resistors 18 and 12 and (ii) ground. The resistors 12, 18, and 19, and the capacitors 13 through 15 of the operational amplifier 11 are arranged in such a way as to shape the frequency response of the active filter. The capacitors 13 through 15 are connected, for example, so as to have a T-connection.

Specifically, the capacitors 13 and 14 (each having capacitance C) are connected in series between the inverting input terminal and the output terminal of the operational amplifier 11. The capacitor 15 (having capacitance αC) is provided between (i) a joint node Vx of the capacitors 13 and 14 and (ii) ground.

A feedback section, between the inverting input terminal and the output terminal of the operational amplifier 11, has effective capacitance $C_{eff}$ which satisfies:

$$C_{eff}=C/(2+\alpha)$$

By using a large value of α for the effective capacitance (combined capacitance) of the feedback section, a small equivalent capacitance can be realized.

The MOS field effect transistor 16 is connected, in parallel, to the capacitor 15 of the capacitor network. The MOS field effect transistor 16 has a drain connected to the joint node Vx, has a source connected to the ground, and has a gate to which a pulse voltage is applied.

The active filter has the transfer function satisfying the following formula:

$$H(s) = \frac{-\left(\frac{R_2}{R_1}\right)}{1+s\left(\frac{C}{2+\alpha}\right)R_3\left(1+\frac{R_2}{R_1}+\frac{R_2}{R_3}\right)+s^2C_1\left(\frac{C}{2+\alpha}\right)R_2R_3} \quad \text{[Formula 9]}$$

Note that the gain K is determined according to a ratio of the resistor 19 (resistance R2) to the resistor 18 (resistance R1): K=R2/R1.

As such, the active filter includes the MOS field effect transistor 16 connected in parallel with the capacitor 15 of the T-connection capacitor network, and the MOS field effect transistor 16 has the drain connected to the joint node Vx, has the source connected to the ground, and has the gate to which the pulse voltage is applied. The MOS field effect transistor 16 is ON while the active filter is deactivated, and is OFF while the active filter is in a normal operation mode.

Here, by short-circuiting the resistor 12 (R3=0) and removing the capacitor 17 (C1=0) from the active filter shown in FIG. 2, it is possible to realize an ordinary first-order leaky integrator circuit having transfer function which satisfies:

$$H_1(s) = \frac{-\left(\frac{R_2}{R_1}\right)}{1+s\left(\frac{C}{2+\alpha}\right)R_2} \quad \text{[Formula 10]}$$

In other words, it is possible to realize an arbitrary n-th-order low-pass active filter, by connecting in cascade the first-order leaky integrator circuit (first transfer function section) and a plurality of the active filters (second transfer function section) of FIG. 2.

The transfer function of the basic building block of the active RC filter, i.e., the transfer function of the Biquad circuit, using the capacitor divider technique (see FIG. 2) is shown here again:

$$H(s) = \frac{-\left(\frac{R_2}{R_1}\right)}{1+s\left(\frac{C}{2+\alpha}\right)R_3\left(1+\frac{R_2}{R_1}+\frac{R_2}{R_3}\right)+s^2C_1\left(\frac{C}{2+\alpha}\right)R_2R_3} \quad \text{[Formula 11]}$$

The active filter shown in FIG. 2 operates like the integrator circuit shown in FIG. 1 as follows. That is, during the normal operation of the active filter, the MOS field effective transistor 16 is OFF. Before the active filter is set for the normal operation mode, the brief reset pulse (φ) is applied to the gate of the MOS field effect transistor 16 so as to reset the joint node Vx to ground.

The aforementioned description explains the case where the circuit technique of the present disclosure is applied to an active low-pass filter and an integrator circuit. However, it should be noted that the present disclosure is not limited to these filter and circuit. It is obvious, for those familiar with the circuit technique, that the circuit technique of the present disclosure is applicable to other type of filters such as a MOSFET-C filter, a Gm-C filter, or a switched capacitor filter. Note also that the circuit technique is not limited to a frequency filter, but is applicable to, for example, an amplifier, a variable gain amplifier, a sample-and-hold circuit, or the like.

For the purpose of describing the circuit technique, the following description deals with the case where the active filter of the present disclosure is applied to an eighth-order low-pass Butterworth filter which is used in a channel selection filter of a wireless transceiver, with reference to FIG. 3.

Figure 4:
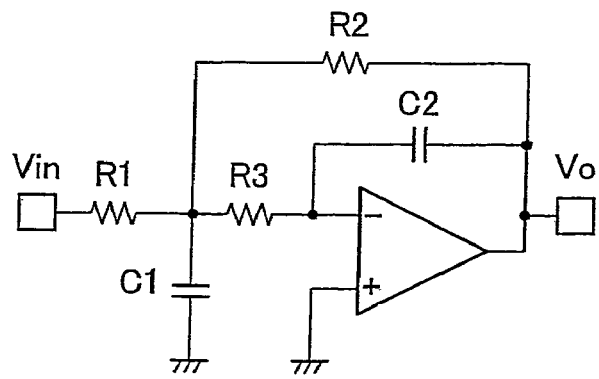
FIG. 4(a) and FIG. 4(b) are explanatory diagrams for the present disclosure and a conventional technique.
Figure 4:
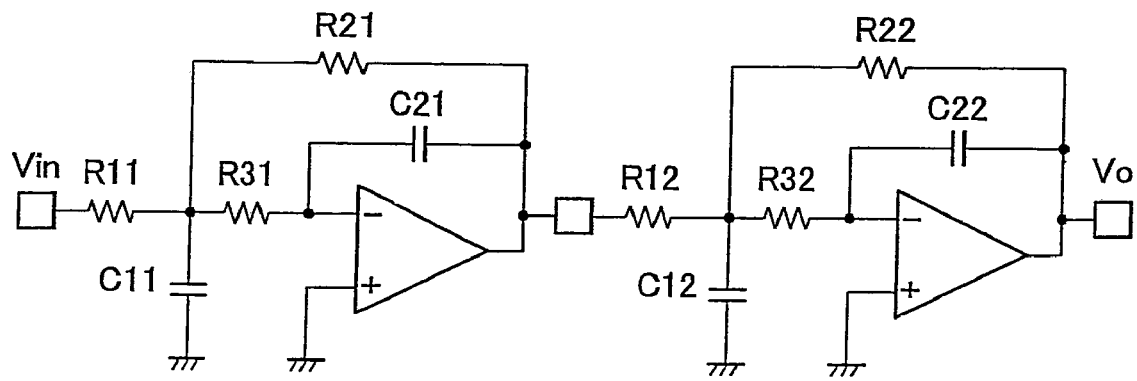
Figure 5:
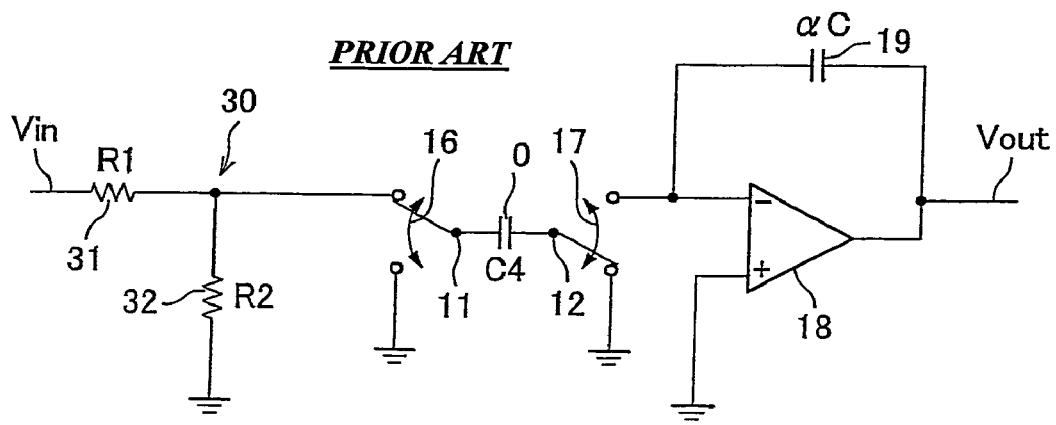
FIG. 5 is a circuit diagram illustrating a conventional technique for reducing capacitance by utilizing resistor-divider.
Figure 6:
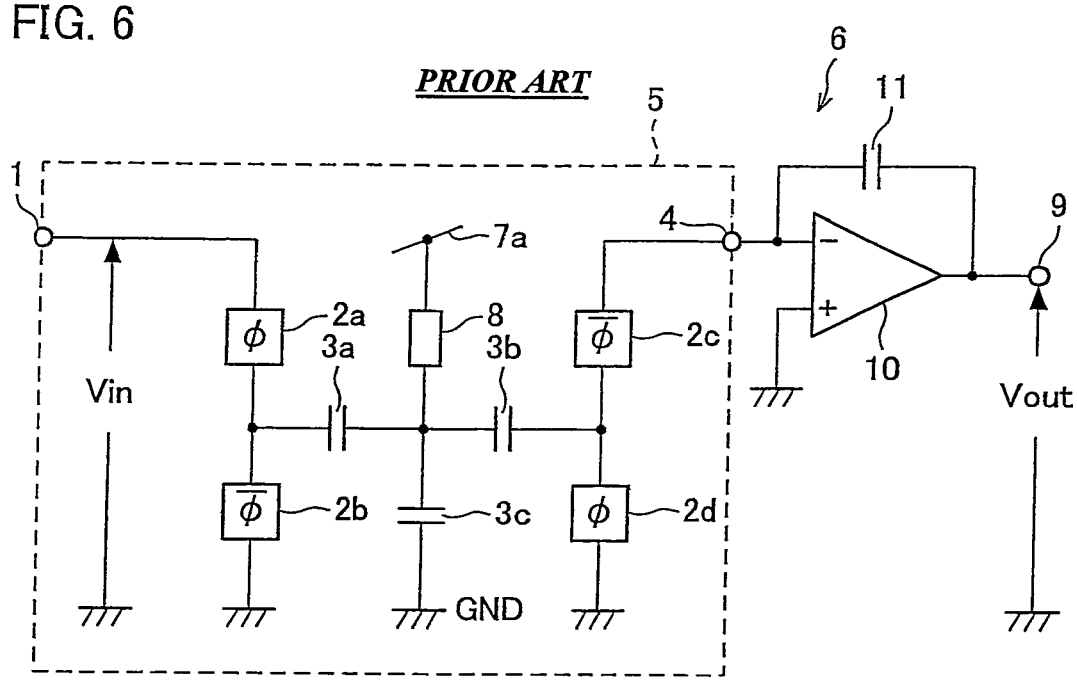
FIG. 6 is a circuit diagram illustrating another conventional technique for reducing capacitance.

The filter has a −3 dB cutoff frequency fc of 7 MHz, and for this realization, the basic Biquad section presented in FIG. 4 is used. In this implementation, as shown in FIG. 3, four Biquad sections are connected in cascade.

For simplicity, it is assumed that all the four Biquad sections have the same resistance. That is, resistors R11 through R14, resistors R21 through R24, resistors R31 through R34 (all shown in FIG. 3) each have resistance R. Further, in FIG. 3, each capacitance of the capacitor C11 through C14 is indicated by $C_1$, and each capacitance of the capacitor C21 through C24 is indicated by $C_2$. The capacitance $C_2$ of the capacitor C21 is effective capacitance (combined capacitance) of a feedback section of the first stage Biquad section.

Table 1 summarizes determined capacitance of the Biquad sections in the case where R=10 kΩ is satisfied. Note that "$1^{st}$ stage" through "$4^{th}$ stage" in Table 1 correspond to the first stage through the fourth stage Biquad sections (see FIG. 3), respectively.

TABLE 1

| | $1^{st}$ Stage | $2^{nd}$ Stage | $3^{rd}$ Stage | $4^{th}$ Stage |
|---|---|---|---|---|
| $C_1$ [pF] | 17.500 | 6.142 | 4.104 | 3.480 |
| $C_2$ [pF] | 0.296 | 0.843 | 1.261 | 1.487 |

As shown in Table 1, the first stage Biquad section has a capacitance ratio k of 59.1 (k=$C_1/C_2$=59.1), and the capacitor C21 has minimum capacitance of 0.296 pF.

For controllability (manufacturability) and reduction of adverse effect of parasitic capacitance, minimum capacitance Cu is selected to be 0.5 pF. Meanwhile, according to a second consideration in the design of the filter, the maximum value of capacitance driven by the operational amplifier must be smaller than 10 pF.

As such, the first stage Biquad section, which has the capacitance $C_1$ of 17.5 pF, must be redesigned by changing the nominal resistor. By using a resistor having resistance R of 20 kΩ, only in the first Biquad section, the capacitance $C_1$ is changed as described in Table 2.

TABLE 2

|  | 1st Stage | 2nd Stage | 3rd Stage | 4th Stage |
|---|---|---|---|---|
| $C_1$ [pF] | 8.75 | 6.142 | 4.104 | 3.480 |
| $C_2$ [pF] | 0.148 | 0.843 | 1.261 | 1.487 |

In the first stage Biquad section, the capacitance $C_2$ of the capacitor C21 is 0.148 pF, and is smaller than the minimum capacitance Cu (=0.5 pF). The first stage Biquad section adopts the arrangement of FIG. 2. FIG. 3 illustrates a final circuitry of the eighth-order low-pass Butterworth filter.

Note that the capacitance $C_2$=0.148 pF of the feedback section of the first stage Biquad section is actually realized as:

C=Cu=0.5 pF, and α=1.38 where C indicates the capacitance of the capacitors 13 and 14. Note that α can be found by substituting $C_{eff}$=0.148 pF and C=0.5 pF in the formula: $C_{eff=C2}$=C/(2+α).

In the original design (see Table 1), the first stage Biquad section has total capacitance of 17.796 pF (=$C_1$+$C_2$=17.5 pF+0.296 pF). In contrast, total capacitance of the new design (See Table 2), in accordance with the present disclosure, using the feedback section (capacitor divider, i.e., capacitors having a T-connection) of FIG. 2, is 8.898 pF (=$C_1$+$C_2$=8.75 pF+0.148 pF).

Further, sum of the capacitance which is in proportion to a capacitance area (i.e., area that the capacitors occupy) is 10.44 pF (=8.75 pF+2×0.5 pF+1.38×0.5 pF), which is 0.586 times as large as the total capacitance (=17.796 pF) of the original design (see Table 1). Therefore, the capacitance area (the area that the capacitors occupy) can be reduced by substantially 41%.

The aforementioned description deals with the case where the reduction of less than 50% in capacitor area can be realized. The following description deals with the case where a reduction of more than 50% in capacitor area can be realized.

In the aforementioned description, when the resistors of the first stage Biquad section shown in FIG. 3 have the resistance R of 20 kΩ, the capacitors have the capacitance shown in Table 2. In the present example, since the resistors of the first stage Biquad section have resistance R of, for example, 30 kΩ, the capacitors have capacitance shown in Table 3. This arrangement allows a reduction of more than 50% in capacitor area.

TABLE 3

|  | 1st Stage | 2nd Stage | 3rd Stage | 4th Stage |
|---|---|---|---|---|
| $C_1$ [pF] | 5.83 | 6.142 | 4.104 | 3.480 |
| $C_2$ [pF] | 0.099 | 0.843 | 1.261 | 1.487 |

Note that the capacitance $C_2$=0.099 pF of the feedback section (shown in FIG. 3) in the first stage Biquad section is actually realized as:

C=Cu=0.5 pF, and α=3.05 where C indicates the capacitance of the capacitors 13 and 14. Note also that α (=3.05) can be found by substituting $C_{eff}$=0.099 pF and C=0.5 pF in the formula: $C_{eff}$=$C_2$=C/(2+α).

As such, the capacitance $C_2$=0.099 pF is realized by the T-connection in which the capacitance C is 0.5 pF and α=3.05. In this case, the first stage Biquad section has total capacitance of 5.926 pF (=5.83 pF+0.099 pF). Further, sum of the capacitance which is in proportion to the capacitance area is 8.355 pF (=5.83 pF+2×0.5 pF+3.05×0.5 pF), which is 0.469 times as large as the total capacitance (=17.796 pF) of the original design (see Table 1). This arrangement ensures approximately 53% reduction in capacitor area.

According to the present disclosure, as described above, it is possible to obtain a capacitor, having minute capacitance that an ordinary technique cannot provide, which determines filter characteristics of an active filter including an operational amplifier when providing such an active filter in a semiconductor integrator circuit (IC) chip. This allows significant reduction in capacitor area.

For example, when manufacturing an analog RC filter, two capacitors are required for an input section and a feed back section from the output section to the input section. Filter characteristics of the analog RC filter are determined by a ratio of capacitance of the input section to capacitance of the feedback section. For improvement in filter characteristic, the capacitance ratio needs to be increased. Increasing the capacitance ratio may be accomplished by reducing capacitance of one (e.g., the feedback section) of the sections as small as possible. In practice, however, when considering a variation during the manufacturing or other factors, the capacitance ratio variation becomes unduly larger, as the capacitive elements have smaller sizes. This causes the filter characteristics to have instability.

In view of the circumstances, in order to realize such minute capacitance, the present disclosure combines a plurality of capacitors used for a filter circuit section in an IC chip. This allows capacitance to be more stable and smaller than in the conventional technique. With the arrangement, it is possible to realize, in the IC chip, capacitive elements which are more stable and smaller than a conventional capacitive element. Accordingly, it is possible to realize a filter having superior filter characteristics, that is, a filter made up of two capacitors whose capacitance ratio is large.

In the present embodiment, the object is achieved by three capacitors having a T-connection. However, there are some cases where the similar effects can be also obtained by connecting a plurality of capacitors in a different manner, for example, in series.

The technique for combining capacitors is also applicable even to a circuit, as shown in FIG. 1, in which capacitors are used only for a feedback section in an operational amplifier. In the case of FIG. 1, small and stable capacitance can be obtained. Of course, the technique is applicable not only to a general RC filter, but also to a recently popular switched capacitor filter or the like.

As apparent from the foregoing description, according to the present disclosure, the following effects are obtained by the realization of an analog continuous-time active filter provided in a semiconductor integrated circuit. Namely, it is possible to reduce, by 50% or greater, the filter area in the semiconductor integrated circuit. Further, the active filter can be realized by normal processing instead of adopting any special technique or any change in the integrated circuit process, while preventing the deterioration in S/N ratio, and the increase in switching noise and power dissipation. Further, it is possible to reduce capacitance of the feedback section in the operational amplifier. It is also possible to reduce the capacitance ratio in the active filter. Further, it is possible to increase operating frequency of the active filter. Further, because the capacitance is reduced, DC (direct current) bias current of the operational amplifier can be reduced for the same operating frequency.

As described above, an active filter according to the present disclosure is arranged so that a plurality of capacitive elements are connected between the output terminal and the inverting input terminal of the operational amplifier.

This allows capacitance reduction of the feedback section in the operational amplifier.

Further, it is possible to realize the Biquad low-pass filter by arranging as follows. That is, the active filter has the first and second capacitors connected in series between the output terminal and the inverting input terminal. The active filter further includes: (1) first and second resistors connected in series between the output terminal of the operational amplifier and an input terminal; (2) a third resistor provided between (i) a joint node of the first and second resistors and (ii) the inverting input terminal of the operational amplifier; and (3) a fourth capacitor provided between (i) a joint node of the first and third resistors and (ii) ground.

In this case, by setting the third capacitor to have large capacitance, it is possible to surely reduce the combined capacitance of the first through third capacitors. This surely prevents an enlargement of the capacitance ratio which equals the capacitance of the fourth capacitor/the combined capacitance of the first through third capacitors.

It is preferable that the capacitors are connected so as to have a T-connection. This ensures small combined capacitance.

It is preferable that the T-connection is realized as follows. That is, the active filter has three capacitive elements that are a first through third capacitor. The first and the second capacitors are connected in series between (i) the output terminal and (ii) the inverting input terminal or between the output terminal and the non-inverting input terminal, and the third capacitor is connected between (i) a joint node of the first and the second capacitors and (ii) ground.

It is preferable that the switching section is connected, in parallel, to the third capacitor. In this case, closing of the switching section brings the joint node (floating node) of the capacitors to be connected to ground via the switching section. On this account, it becomes possible to remove (discharge) electric charges accumulated at the joint node. This ensures that fast and accurate filter processing is always carried out.

Further, it is possible to realize the highly accurate Biquad low-pass filter by arranging as follows. That is, the active filter has first and second capacitors connected in series between the output terminal and the inverting input terminal. The active filter further includes: (1) a first and a second resistors connected in series between the output terminal of the operational amplifier and an input terminal and the output terminal; (2) a third resistor provided between (i) a joint node of the first and the second resistors and (ii) the inverting input terminal of the operational amplifier; and (3) a fourth capacitor provided between (i) a joint node of the first and the third resistors and (ii) ground.

In this case, by setting the third capacitor to have large capacitance, it is possible to surely reduce the combined capacitance of the first through third capacitors. This surely prevents an enlargement of the capacitance ratio which equals the capacitance of the fourth capacitor/the combined capacitance of the first through third capacitors.

Further, it is possible to realize a highly accurate integrator circuit by arranging as follows. That is, the active filter has first and second capacitors connected in series between the output terminal and the inverting input terminal. The active filter further includes: (1) a first resistor connected between the inverting input terminal of the operational amplifier and an input terminal and the inverting input terminal; and (2) a second resistor connected between the output terminal and the inverting input terminal of the operational amplifier.

It is preferable that the first through the third capacitors of a T-connection are arranged so that the first and the second capacitors have the same capacitance, and the third capacitor has capacitance a predetermined number of times as large as the first capacitor. This ensures that the design of an active filter is accurately carried out with ease in a short time.

By connecting, in cascade, the Biquad low-pass filter to at least one of the integrator circuits, it is possible to realize an accurate n-th order (n being integer of not less than 2) low-pass filter.

The present disclosure is realized with the use of ordinary processing instead of adopting any special technique or any change in integrated circuit process, while preventing the deterioration in S/N ratio, and the increase in switching noise and power dissipation. The present disclosure can reduce the capacitance of the feedback section in the operational amplifier. As such, the present disclosure is applicable to a filter technique for a continuous type active filter, a switched capacitor active filter, or the like, each of which includes an operational amplifier.

The present disclosure is not limited to the embodiments above, but may be altered within the scope of the claims. An embodiment based on a proper combination of technical means disclosed in different embodiments is encompassed in the technical scope of the present disclosure.

What is claimed is:

1. An active filter, comprising:
an operational amplifier in a semiconductor integrated circuit device, the operational amplifier having an output terminal, an inverting input terminal, and a non-inverting input terminal,
a plurality of capacitive elements, provided between the output terminal and the inverting input terminal, and
a switching section,
wherein the plurality of capacitive elements comprise first, second and third capacitors, and the third capacitor is in parallel with the switching section and connected between (i) a joint node of the first and second capacitors and (ii) ground.

2. The active filter as set forth in claim 1, wherein:
the capacitive elements are the first through third capacitors, and
the first and second capacitors are connected in series between the output terminal and the inverting input terminal.

3. The active filter as set forth in claim 2, wherein:
the active filter, further comprises:
first and second resistors connected in series between the output terminal of the operational amplifier and an input terminal;
a third resistor provided between (i) a joint node of the first and second resistors and (ii) the inverting input terminal of the operational amplifier; and
a fourth capacitor provided between (i) a joint node of the first and third resistors and (ii) ground.

4. The active filter as set forth in claim 1, wherein:
the active filter, further comprises:

a first resistor connected between the inverting input terminal of the operational amplifier and an input terminal; and a second resistor connected between the output terminal and the inverting input terminal of the operational amplifier.

5. The active filter as set forth in claim 2, wherein:
the first and second capacitors have a same capacitance, and the third capacitor has capacitance which is a predetermined number of times as large as the first capacitor.

6. The active filter as set forth in claim 3, wherein:
the first and second capacitors have a same capacitance, and the third capacitor has capacitance a predetermined number of times as large as the first capacitor.

7. The active filter as set forth in claim 1, wherein:
the switching section is realized by a MOS field effect transistor.

8. The active filter as set forth in claim 1, wherein:
the switching section turns ON before the active filter is set in a normal operation mode, and is OFF while the active filter is in the normal operation mode.

9. An active filter, comprising:
a first active filter; and
at least one second active filter,
the first active filter and said at least one second active filter being connected in cascade;
the first active filter, including:
a first operational amplifier having an output terminal and an inverting input terminal;
first through third capacitors connected between the output terminal and the inverting input terminal;
the first and second capacitors being connected in series between the output terminal and the inverting input terminal, and the third capacitor being connected between (i) a joint node of the first and second capacitors and (ii) ground,
a first switching section connected in parallel with the third capacitor;
first and second resistors connected in series between the output terminal of the operational amplifier and an input terminal;
a third resistor provided between (i) a joint node of the first and second resistors and (ii) the inverting input terminal of the operational amplifier; and
a fourth capacitor provided between (i) a joint node of the first and third resistors and (ii) ground,
said second active filter, including:
an operational amplifier having an output terminal and an inverting input terminal;
fifth through seventh capacitors connected between the output terminal and the inverting input terminal;
the fifth and sixth capacitors being connected in series between the output terminal and the inverting input terminal, and the seventh capacitor being connected between (i) a joint node of the fifth and sixth capacitors and (ii) ground, a second switching section connected in parallel with the seventh capacitor, a fourth resistor connected between the inverting input terminal of the operational amplifier and an input terminal; and a fifth resistor connected between the output terminal and the inverting input terminal of the operational amplifier.

10. A wireless transceiver, comprising an active filter, said active filter, including:
an operational amplifier in a semiconductor integrated circuit device, the operational amplifier having an output terminal and an inverting input terminal;
first through third capacitors connected between the output terminal and the inverting input terminal;
the first and second capacitors being connected in series between the output terminal and the inverting input terminal, and the third capacitor being connected between (i) a joint node of the first and second capacitors and (ii) ground,
a first switching section connected in parallel with the third capacitor;
first and second resistors connected in series between the output terminal of the operational amplifier and an input terminal;
a third resistor provided between (i) a joint node of the first and second resistors and (ii) the inverting input terminal of the operational amplifier; and
a fourth capacitor provided between (i) a joint node of the first and third resistors and (ii) ground.

11. An active filter comprising:
an operational amplifier having an output terminal, an inverting terminal and a non-inverting terminal;
at least three capacitive elements coupled at a junction provided between the output terminal and the inverting terminal; and
a switching section connected between the junction of the at least three capacitive elements and ground such that the switching section is off during normal operation of the operational amplifier and a reset pulse is applied to temporarily activate the switching section and, in turn, remove accumulated electric charges from the at least three capacitive elements.

12. An active filter comprising:
an operational amplifier having an output terminal, an inverting terminal and a non-inverting terminal;
at least three capacitive elements provided between the output terminal and the non-inverting terminal; and
a switching section connected to the at least three capacitive elements such that the switching section is off during normal operation of the operational amplifier and a reset pulse is applied to temporarily activate the switching section and, in turn, remove accumulated electric charges from the at least three capacitive elements.

* * * * *